(12) United States Patent
Adnan et al.

(10) Patent No.: US 12,587,225 B2
(45) Date of Patent: Mar. 24, 2026

(54) ACTIVE POWER SPLITTER AND COMBINER CIRCUITRY

(71) Applicant: Apple Inc., Cupertino, CA (US)

(72) Inventors: Muhammad Adnan, San Jose, CA (US); Abdulrahman A Alhamed, Riyadh (SA); Xiang Guan, Saratoga, CA (US); Frederic Bossu, Carlsbad, CA (US)

(73) Assignee: Apple Inc., Cupertino, CA (US)

( * ) Notice: Subject to any disclaimer, the term of this patent is extended or adjusted under 35 U.S.C. 154(b) by 304 days.

(21) Appl. No.: 18/339,870

(22) Filed: Jun. 22, 2023

(65) Prior Publication Data

US 2024/0097728 A1 Mar. 21, 2024

Related U.S. Application Data

(60) Provisional application No. 63/408,229, filed on Sep. 20, 2022.

(51) Int. Cl.
| | |
|---|---|
| H04B 1/18 | (2006.01) |
| H03F 1/56 | (2006.01) |
| H03F 3/19 | (2006.01) |
| H04B 1/04 | (2006.01) |

(52) U.S. Cl.
CPC ................ H04B 1/18 (2013.01); H03F 1/56 (2013.01); H03F 3/19 (2013.01); H04B 1/0458 (2013.01); H03F 2200/451 (2013.01)

(58) Field of Classification Search
CPC ........... H04B 1/18; H04B 1/0458; H03F 1/56; H03F 3/19; H03F 2200/451
See application file for complete search history.

(56) References Cited

U.S. PATENT DOCUMENTS

| | | | |
|---|---|---|---|
| 5,504,493 A | 4/1996 | Hirshfield | |
| 7,907,100 B2 | 3/2011 | Mortazawi et al. | |

(Continued)

FOREIGN PATENT DOCUMENTS

| | | |
|---|---|---|
| CN | 108736840 A | 11/2018 |
| EP | 3958463 A1 | 2/2022 |

OTHER PUBLICATIONS

Valdes-Garcia Alberto et al: "A fully integrated 16-element phased-array transmitter in SiGe BiCMOS for 60-GHz Communications", IEEE Journal of Solid-State Circuits, vol. 45, No. 12, Dec. 1, 2010, pp. 2757-2773, XP093131097 USA ISSN: 0018-9200, DOI:10.1109/JSSC.20102074951. (Year: 2010).*

(Continued)

*Primary Examiner* — John J Lee

(74) *Attorney, Agent, or Firm* — Treyz Law Group; Jason Tsai

(57) ABSTRACT

An electronic device may include wireless circuitry having active circuitry such as active power splitter circuitry and active power combiner circuitry. The active power splitter and combiner circuitry can include single-ended or differential amplifiers coupled to one another using single-ended coupled lines or differential coupled lines. Each set of differential coupled lines may include first and second pairs of coupled lines. The single-ended coupled lines and the differential coupled lines can provide routing and impedance matching functions. In active power splitter circuitry, multiple transmitting amplifiers may be used to drive a plurality of antennas in a phased antenna array. In active power combiner circuitry, multiple receiving amplifiers may be used to receive radio-frequency signals from the plurality of antennas in the phased antenna array.

19 Claims, 10 Drawing Sheets

(56) References Cited

U.S. PATENT DOCUMENTS

| | | | |
|---|---|---|---|
| 7,944,304 | B1 | 5/2011 | Patten |
| 10,446,938 | B1 | 10/2019 | Wang et al. |
| 11,043,736 | B2 | 6/2021 | Difonzo et al. |
| 11,189,911 | B2 | 11/2021 | Zhu |
| 11,424,539 | B2 | 8/2022 | Alpman et al. |
| 2017/0026009 | A1 | 1/2017 | Xue et al. |
| 2017/0346506 | A1* | 11/2017 | Perumana ............ H04B 1/0458 |
| 2020/0053490 | A1* | 2/2020 | Shriner ................ H04R 25/554 |
| 2020/0367257 | A1 | 11/2020 | Hormis et al. |
| 2022/0059920 | A1 | 2/2022 | Yoon et al. |
| 2022/0255215 | A1 | 8/2022 | Park et al. |
| 2023/0198470 | A1* | 6/2023 | Pellerano ................ H03F 3/213 |
| | | | 330/124 R |

OTHER PUBLICATIONS

Deukhyoun Heo et al., Integrated Eight Element Ku Band Transmit/Receive Beamformer Chipset for Low-Cost Commercial Phased Array Antennas, 2010 IEEE International Symposium on Phased Array Systems and Technology, 2010, pp. 653-659, IEEE, New York, NY, United States.

Alberto Valdes-Garcia et al., "A Fully Integrated 16-Element Phased-Array Transmitter in SiGe BiCMOS for 60-GHz Communications," IEEE Journal of Solid-State Circuits, Dec. 1, 2010, pp. 2757-2773, vol. 45, No. 12, IEEE, United States.

Donghyup Shin et al., "A High-Power Packaged Four-Element X-Band Phased-Array Transmitter in 0.13-μm CMOS for Radar and Communication Systems," IEEE Transactions on Microwave Theory and Techniques, Aug. 1, 2013, pp. 3060-3071, vol. 61, No. 8, IEEE, United States.

Mohamed Elkhouly, "220-250-GHz Phased-Array Circuits in 0.13-μm SiGe BiCMOS Technology," IEEE Transactions on Microwave Theory and Techniques, Aug. 1, 2013, pp. 3115-3127, vol. 61, No. 8, IEEE, United States.

* cited by examiner

ACTIVE POWER SPLITTER AND COMBINER CIRCUITRY

This application claims the benefit of U.S. Provisional Patent Application No. 63/408,229, filed Sep. 20, 2022, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals in a transmit path can be split into multiple channels using a radio-frequency divider, whereas radio-frequency signals in a receive path from multiple channels can be merged using a radio-frequency combiner. Conventional radio-frequency dividers and combiners such as the Wilkinson power divider and the Wilkinson power combiner are passive circuits that exhibit a substantial amount of power loss due to the passive splitter/combiner mechanism and also due to ohmic loss in the transmission lines. Conventional passive splitters and combiners can also occupy a substantial amount of circuit area. It is within this context that the embodiments herein arise.

SUMMARY

An electronic device may include wireless communications circuitry. The wireless communications circuitry may include one or more processors or signal processing blocks for generating and receiving baseband (digital) signals, a transceiver having a transmitter for generating corresponding radio-frequency signals based on the baseband signals and having a receiver for generating corresponding baseband signals based on received radio-frequency signals, one or more radio-frequency transmitting amplifiers configured to amplify the radio-frequency signals for transmission by one or more antennas in the electronic device, and one or more radio-frequency receiving amplifiers configured to amplify radio-frequency signals received by one or more antennas in the electronic device.

An aspect of the disclosure provides power splitter circuitry that includes a first amplifier stage and a second amplifier stage configured to receive radio-frequency signals from the first amplifier stage, the second amplifier stage including a first output amplifier coupled to first and second output channels and a second output amplifier coupled to third and fourth output channels. The various output channels can each include an antenna and a phase and magnitude controller. The first and second output amplifiers can be differential amplifiers. The power splitter circuitry can further include a first set of differential coupled lines coupling the first output amplifier to the first and second output channels and a second set of differential coupled lines coupling the second output amplifier to the third and fourth output channels. Each set of differential coupled lines can include a first pair of coupled lines and a second pair of coupled lines. The first amplifier stage can be a differential amplifier having first and second input transistors and two pairs of cascode transistors.

An aspect of the disclosure provides wireless circuitry that includes a mixer, a plurality of antennas, and active circuitry coupled between the mixer and the plurality of antennas, the active circuitry having a first amplifier stage, a second amplifier stage configured to receive radio-frequency signals from the first amplifier stage, and at least first and second sets of differential coupled lines coupled between the first and second amplifier stages and configured to provide impedance matching between the first and second amplifier stages. The active circuitry can be active splitter circuitry that further includes a third set of differential coupled lines coupling the first differential amplifier to first and second antennas in the plurality of antennas and a fourth set of differential coupled lines coupling the second differential amplifier to the third and fourth antennas in the plurality of antennas. Alternatively, the active circuitry can be active combiner circuitry that further includes a third set of differential coupled lines coupling first and second antennas in the plurality of antennas to the first differential amplifier and a fourth set of differential coupled lines third and fourth antennas in the plurality of antennas to the second differential amplifier.

An aspect of the disclosure provides active splitter circuitry that includes a first amplifier configured to receive signals via a set of input coupled lines and configured to drive a first load component, a second amplifier configured to receive signals via the set of input coupled lines and configured to drive a second load component, a third amplifier configured to receive signals via the set of input coupled lines and configured to drive a third load component, and a fourth amplifier configured to receive signals via the set of input coupled lines and configured to drive a fourth load component. The various load components can be different antennas in a phased antenna array. The input coupled lines can be a pair of single-ended coupled lines or a set of differential coupled lines. The active splitter circuitry can further include a first pair of single-ended coupled lines or a first set of differential coupled lines coupled between the first amplifier and the first load component, a second pair of single-ended coupled lines or a second set of differential coupled lines coupled between the second amplifier and the second load component, a third pair of single-ended coupled lines or a third set of differential coupled lines coupled between the third amplifier and the third load component, and/or a fourth pair of single-ended coupled lines or a fourth set of differential coupled lines coupled between the fourth amplifier and the fourth load component.

DETAILED DESCRIPTION

Figure 1:
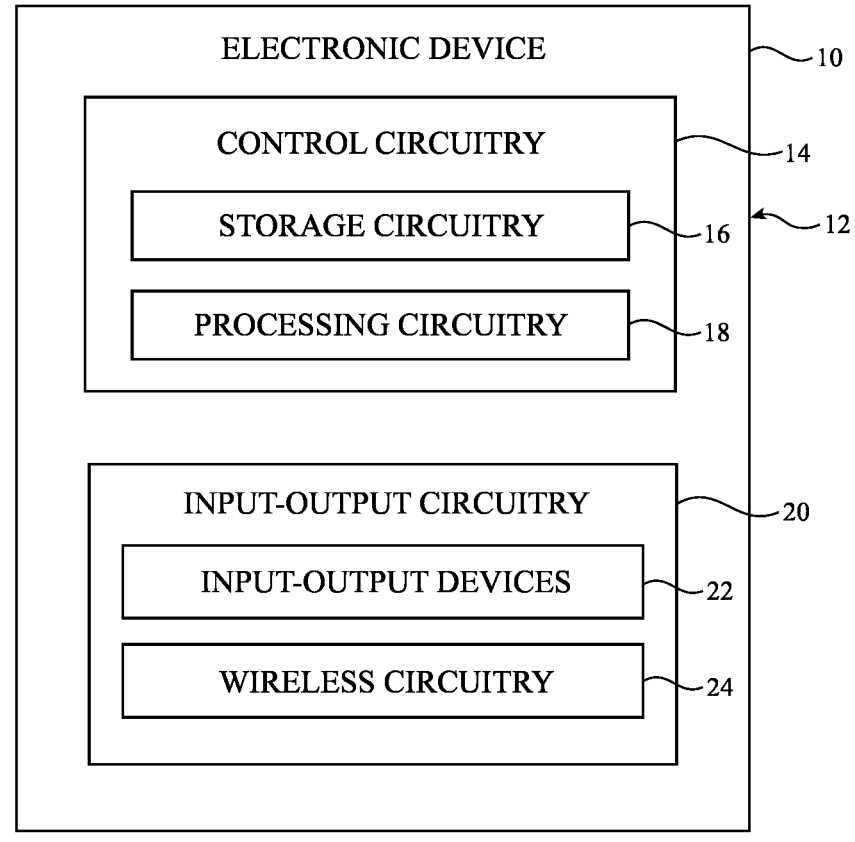
FIG. 1 is a diagram of an illustrative electronic device having wireless circuitry in accordance with some embodiments.

An electronic device such as device 10 of FIG. 1 may be provided with wireless circuitry. The wireless circuitry may include one or more mixers coupled to active power divider circuitry and to active power combiner circuitry. Active power divider circuitry can include active gain stages without any transformers. The active power divider circuitry can include coupled lines such as differential coupled lines configured to provide both routing and input/output impedance matching for the various active gain stages without having to rely on any transformers. Compared to passive power dividers, active power dividers configured in this way exhibits relatively smaller area and reduced power loss. Active power combiners can be implemented in a similar fashion.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
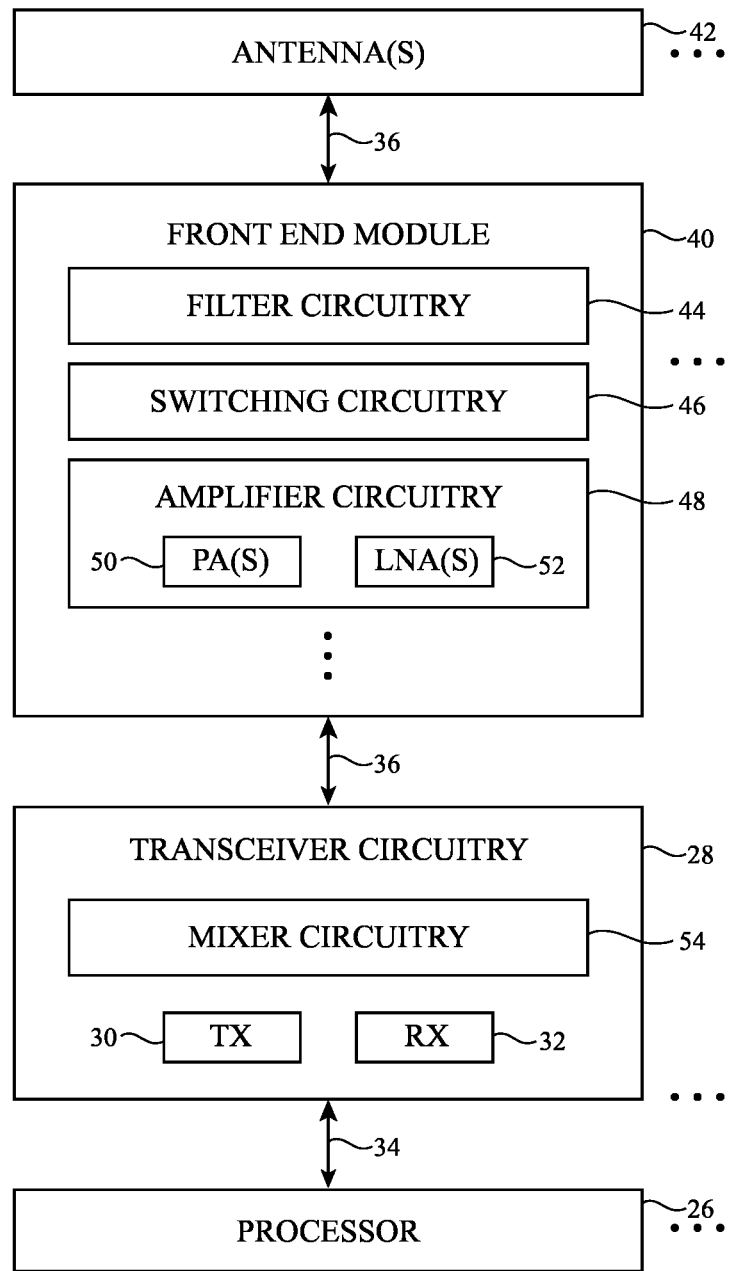
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry 54 for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry 54 for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
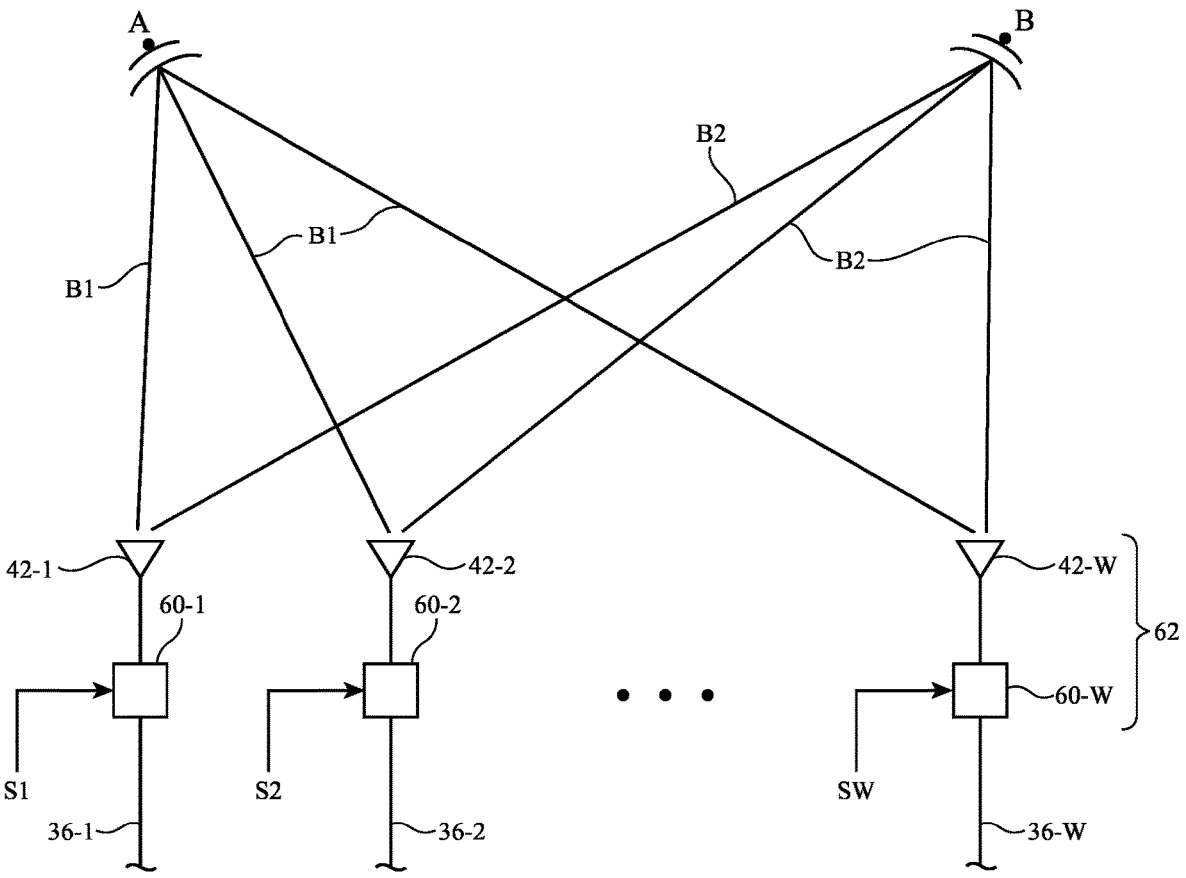
FIG. 3 is a diagram of an illustrative phased antenna array that may be adjusted to form beams of signals oriented in different directions in accordance with some embodiments.

Two or more antennas 42 may be arranged in one or more phased antenna arrays. FIG. 3 shows how antennas 42 may be formed in a corresponding phased antenna array 62. As shown in FIG. 3, phased antenna array 62 (sometimes referred to herein as array 62, antenna array 62, or array 62 of antennas 42) may be coupled to radio-frequency transmission lines 36. For example, a first antenna 42-1 in phased antenna array 62 may be coupled to a first radio-frequency transmission line 36-1, a second antenna 42-2 in phased antenna array 62 may be coupled to a second radio-frequency transmission line 36-2, . . . , and a W$^{th}$ antenna 42-W in phased antenna array 62 may be coupled to a W$^{th}$ radio-frequency transmission line 36-W, etc. While antennas 42 are described herein as forming a phased antenna array, the antennas 42 in phased antenna array 62 may sometimes also be referred to as collectively forming a single phased array antenna (e.g., where antennas 42 form antenna elements of the phased array antenna).

Antennas 42 in phased antenna array 62 may be arranged in any desired number of rows and columns or in any other desired pattern (e.g., the antennas need not be arranged in a grid pattern having rows and columns). Each antenna 42 may be separated from one or more adjacent antennas in phased antenna array 62 by a predetermined distance such as approximately half an effective wavelength of operation of the array. During signal transmission operations, radio-frequency transmission lines 36 may be used to supply signals (e.g., radio-frequency signals such as millimeter wave and/or centimeter wave signals) from transceiver circuitry to phased antenna array 62 for wireless transmission. During signal reception operations, radio-frequency transmission lines 36 may be used to supply signals received at phased antenna array 62 (e.g., from external wireless equipment or transmitted signals that have been reflected off of external objects) to transceiver circuitry.

The use of multiple antennas 42 in phased antenna array 62 allows beam forming/steering arrangements to be implemented by controlling the relative phases and magnitudes (amplitudes) of the radio-frequency signals conveyed by the antennas. In the example of FIG. 3, antennas 42 each have a corresponding radio-frequency phase and magnitude controller 60 (e.g., a first phase and magnitude controller 60-1 disposed on radio-frequency transmission line 36-1 may control phase and magnitude for radio-frequency signals handled by antenna 42-1, a second phase and magnitude controller 60-2 disposed on radio-frequency transmission line 36-2 may control phase and magnitude for radio-frequency signals handled by antenna 42-2, . . . , and a W$^{th}$ phase and magnitude controller 60-W disposed on radio-frequency transmission line 36-W may control phase and magnitude for radio-frequency signals handled by antenna 42-W, etc.).

Phase and magnitude controllers 60 may each include circuitry for adjusting the phase of the radio-frequency signals on radio-frequency transmission lines 36 (e.g., phase shifter circuits) and/or circuitry for adjusting the magnitude of the radio-frequency signals on radio-frequency transmission lines 36 (e.g., power amplifier and/or low noise amplifier circuits). Phase and magnitude controllers 60 may sometimes be referred to collectively herein as beam steering circuitry or beam forming circuitry (e.g., beam steering/forming circuitry that steers/forms the beam of radio-frequency signals transmitted and/or received by phased antenna array 46).

Phase and magnitude controllers 60 may adjust the relative phases and/or magnitudes of the transmitted signals that are provided to each of the antennas in phased antenna array 62 and may adjust the relative phases and/or magnitudes of the received signals that are received by phased antenna array 62. Phase and magnitude controllers 60 may, if desired, include phase detection circuitry for detecting the phases of the received signals that are received by phased antenna array 62. The term "beam" or "signal beam" may be used herein to collectively refer to wireless signals that are transmitted and/or received by phased antenna array 62 in a particular direction. Each beam may exhibit a peak gain that is oriented in a respective beam pointing direction at a corresponding beam pointing angle (e.g., based on constructive and destructive interference from the combination of signals from each antenna in the phased antenna array). Different sets of phase and magnitude settings for phase and magnitude controllers 60 may configure phased antenna array 62 to form different beams in different beam pointing directions.

If, for example, phase and magnitude controllers 60 are adjusted to produce a first set of phases and/or magnitudes, the signals will form a beam as shown by beam B1 of FIG. 3 that is oriented in the direction of point A. If, however, phase and magnitude controllers 60 are adjusted to produce a second set of phases and/or magnitudes, the signals will form a beam as shown by beam B2 that is oriented in the direction of point B. Each phase and magnitude controller 60 may be controlled to produce a desired phase and/or magnitude based on a corresponding control signal S received from control circuitry 14 of FIG. 1 (e.g., the phase and/or magnitude provided by phase and magnitude controller 60-1 may be controlled using control signal 51, the phase and/or magnitude provided by phase and magnitude controller 60-2 may be controlled using control signal S2, . . . , and the phase and/or magnitude provided by phase and magnitude controller 60-W may be controlled using control signal SW, etc.). If desired, the control circuitry may actively adjust control signals S in real time to steer (form) the beam in different desired directions over time. Phase and magnitude controllers 60 may provide information identifying the phase of received signals to control circuitry 14 if desired.

When performing wireless communications using radio-frequency signals at relatively high frequencies such as millimeter and centimeter wave frequencies, radio-frequency signals are conveyed over a line-of-sight path between phased antenna array 62 and external communications equipment. If the external equipment is located at point A of FIG. 3, phase and magnitude controllers 60 may be adjusted to steer the signal beam towards point A (e.g., to steer the pointing direction of the signal beam towards point A). Phased antenna array 62 may transmit and receive radio-frequency signals in the direction of point A. Similarly, if the external equipment is located at point B, phase and magnitude controllers 60 may be adjusted to steer the signal beam towards point B (e.g., to steer the pointing direction of the signal beam towards point B). Phased antenna array 62 may transmit and receive radio-frequency signals in the direction of point B.

In the example of FIG. 3, beam steering is shown as being performed over a single degree of freedom for the sake of simplicity (e.g., towards the left and right on the page of FIG. 3). However, in practice, the beam may be steered over two or more degrees of freedom (e.g., in three dimensions, into and out of the page and to the left and right on the page of FIG. 3). Phased antenna array 62 may have a corresponding field of view over which beam steering can be performed (e.g., in a hemisphere or a segment of a hemisphere over the phased antenna array).

If desired, device 10 may include multiple phased antenna arrays 62 that each face a different direction to provide coverage from multiple sides of the device. Each phased antenna array 62 may be formed as a part of a respective antenna panel (AP) within device 10. If desired, multiple phased antenna arrays 62 may be disposed on a single antenna panel and/or a single phased antenna array 62 may be distributed across two or more antenna panels. The antenna panels may be disposed at different locations on device 10 for providing a full sphere of beam coverage around device 10.

The antennas in a phased antenna array can be coupled to a power divider. For instance, a conventional transmit chain can include a mixer, variable gain amplifiers coupled to an output of the mixer, large preamplifiers coupled to an output of the variable gain amplifiers (i.e., the preamplifiers are larger or have greater drive strength than the preceding variable gain amplifiers), and a passive power divider coupled between an output of the preamplifiers and the front end of the phased antenna array. The front end in the radio-frequency beam forming circuit can contain a phase shifter and a power amplifier. A passive power divider such as the Wilkinson power divider can be used to divide or split a radio-frequency signal at the output of the preamplifiers into a plurality of isolated output ports coupled to respective antennas in the phased antenna array. Such types of passive power dividers do not have any active amplifiers within the divider chain (tree) and can exhibit a high amount of ohmic (power) loss along the divider chain. Moreover, the variable gain amplifiers and the large preamplifiers that are needed to drive such passive power divider can occupy a substantial amount of chip area and can consume a substantial amount of power.

Figure 4:
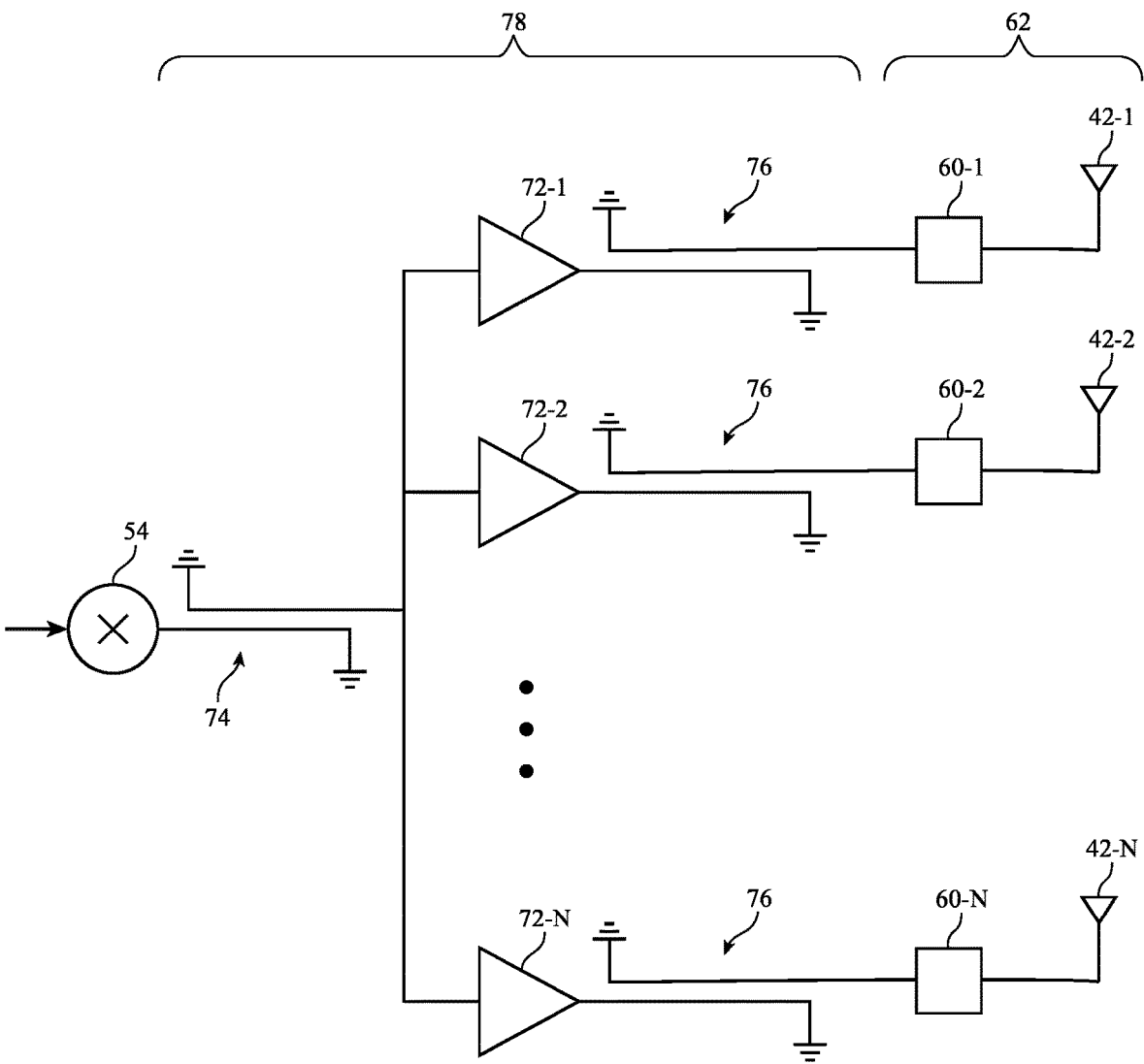
FIG. 4 is a diagram of illustrative active power divider circuitry having an output stage with single-ended amplifier outputs in accordance with some embodiments.

In accordance with an embodiment, active power splitter circuitry such as active power splitter circuitry 78 that exhibits lower loss and higher gain performance relative to conventional passive power splitters is shown in FIG. 4. Active power splitter circuitry 78 of FIG. 4 may be a 1:N active power splitter and is sometimes referred to as a power divider, a radio-frequency signal divider, or a radio-frequency power divider. Power splitter circuitry 78 can be configured to divide or split an input signal into multiple (N) output branches or channels with a high degree of isolation between the various output channels (i.e., to ensure minimal crosstalk between the different channels).

As shown in FIG. 4, active power splitter 78 may include an active gain stage having N amplifiers 72 (e.g., a first amplifier 72-1, a second amplifier 72-2, . . . , and an $N^{th}$ amplifier 72-N). As an example, amplifiers 72 each have an input configured to receive a radio-frequency signal from a transmitting mixer 54 via input coupled lines 74. Input coupled lines 74 may represent single-ended coupled lines or differential coupled lines (DCL). In accordance with an embodiment, differential coupled lines can be used to provide both impedance matching and routing functions. The dual purpose of differential coupled lines can obviate the use of impedance matching transformers in a radio-frequency signal path, which can help substantially reduce chip area while minimizing matching/power loss in the radio-frequency signal path.

Figures 5, 6:
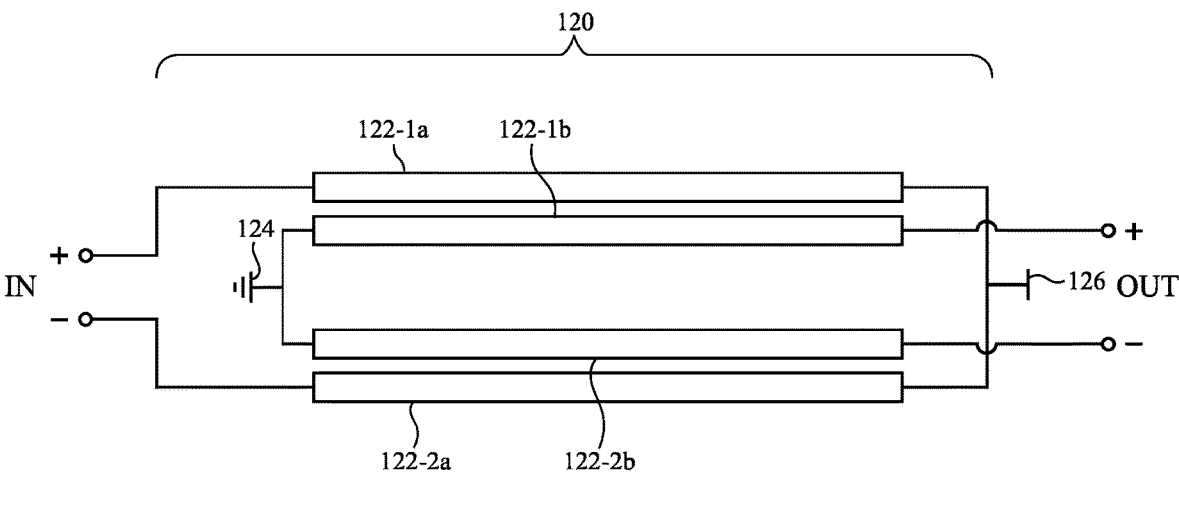
FIG. 5 is a diagram of illustrative active power combiner circuitry having an input stage with single-ended amplifier inputs in accordance with some embodiments.
FIG. 6 is a diagram of illustrative active power divider circuitry having an output stage with differential amplifier outputs in accordance with some embodiments.

FIG. 5 is a diagram of an illustrative set of differential coupled lines 120. Differential coupled lines (DCL) 120 may include a first pair of coupled lines 122-1a and 122-1b and a second pair of coupled lines 122-2a and 122-2b. "Differential" coupled lines 120 can be defined to have a differential input port IN and a differential output port OUT. Line 122-1a may be a conductive routing path having a first terminal (a first distal end) coupled to differential input port IN and having a second terminal (a second distal end) coupled to a bias voltage line 126. Bias voltage line 126 may receive a positive power supply voltage or some other bias voltage less than or greater than the positive power supply voltage. Line 122-1b may be a conductive routing path having a first terminal (a first distal end) coupled to a ground line 124 (e.g., a ground power supply line on which a ground voltage is provided) and having a second terminal (a second distal end) coupled to differential output port OUT. Lines 124 and 126 are AC grounds in the differential operation and can be conveniently used to provide biasing or power supply to the preceding and/or following circuit block.

Lines 122-1a and 122-1b may be routed parallel to each another. Although drawn as straight lines in the example of FIG. 5, lines 122-1a and 122-1b need not be completely straight and can have one or more turns, can be curved, can be routed vertically and/or horizontally across the surface of an integrated circuit chip, and/or can form a routing path with any desired shape. Lines 122-1a and 122-1b can have the same footprint. Line 122-1b should generally be routed along or follow line 122-1a and therefore has the same or similar length as line 122-1a. The amount of capacitive and magnetic coupling between lines 122-1a and 122-1b should be designed by selecting the spacing between them to satisfy the required impedance transformation requirement between the preceding and succeeding circuitry. Lines 122-1a and 122-1b can be fairly long. As examples, lines 122-1a and 122-1b can each be at least 50 microns in length, 50-100 microns in length, 100-200 microns in length, 200-400 microns in length, or more than 400 microns long. Conductive lines 122-1a and 122-1b that are routed close to and alongside each other are sometimes referred to collectively and defined as "coupled lines" or a pair of coupled lines that are capacitively and magnetically coupled to one another.

Coupled lines 122-1a and 122-1b may be formed laterally next to each other (e.g., using an edged-coupled line configuration), may be formed vertically on top of one another (e.g., using a broadside-coupled line configuration), or can be implemented as edge-coupled coplanar waveguides, edge-coupled coplanar waveguides with ground, edge-coupled grounded coplanar waveguides, or other types of coupled waveguide, stripline, or microstrip line arrangements.

Line 122-2a may be a conductive routing path having a first terminal (a first distal end) coupled to input IN port and having a second terminal (a second distal end) coupled to bias voltage line 126. Line 122-2b may be a conductive routing path having a first terminal (a first distal end) coupled to ground line 124 and having a second terminal (a second distal end) coupled to output port OUT. Output port OUT (e.g., a differential interface) may be coupled to an interface to another integrated circuit chip, one or more antennas, or some other load component(s).

Lines 122-2a and 122-2b may be routed parallel to each another. Although drawn as straight lines in the example of FIG. 5, lines 122-2a and 122-2b need not be completely straight and can have one or more turns, can be curved, can be routed vertically and/or horizontally across the surface of an integrated circuit chip, and/or can form a routing path with any desired shape. Lines 122-2a and 122-2b can have the same footprint. Line 122-2b should generally be routed along or follow line 122-2a and therefore has the same or similar length as line 122-2a. The amount of capacitive and magnetic coupling between lines 122-2a and 122-2b should be designed by selecting the spacing between them to satisfy the required impedance transformation requirement between the preceding and succeeding circuitry.

Lines 122-2a and 122-2b can be fairly long. As examples, lines 122-2a and 122-2b can each be at least 50 microns in length, 50-100 microns in length, 100-200 microns in length, 200-400 microns in length, or more than 400 microns long. Conductive lines 122-2a and 122-2b that are routed close to and alongside each other are sometimes referred to collectively and defined as "coupled lines" or a pair of coupled lines. Coupled lines 122-2a and 122-2b may be edged-coupled lines, broadside-coupled lines, an edge-coupled coplanar waveguide, an edge-coupled coplanar waveguide with ground, an edge-coupled grounded coplanar waveguide, or other types of coupled waveguide, stripline, or microstrip line arrangements.

To maintain proper balance of a differential signal being routed through differential coupled lines 120, the first pair of coupled lines 122-1*a* and 122-1*b* and the second pair of coupled lines 122-2*a* and 122-2*b* should generally be routed in the same way in the same direction (e.g., in a symmetrical manner).

As described above, the first pair of coupled lines 122-1*a* and 122-1*b* and the second pair of coupled lines 122-2*a* and 122-2*b* can be referred to collectively and defined as differential coupled lines 120. Differential coupled lines 120 can not only be used to provide routing but can also be used to provide impedance matching. For example, consider a scenario in which output port OUT is connected to a 100 Ohm load. In such scenario, differential coupled lines 120 can be designed and configured (e.g., by selecting the length, width, shape, footprint, and other physical characteristics of the coupled lines) to match the impedance of the output port to the 100 Ohm load. Using only differential coupled lines 120 to provide an impedance matching function obviates the need for a separate output transformer, which can dramatically reduce circuit area that would otherwise be occupied by the output transformer while also minimizing matching/power loss through the radio-frequency signal path. This example of using differential coupled lines 120 to match to a 100 Ohm load is illustrative. In general, differential coupled lines 120 can be used to provide impedance matching to a 50 Ohm load, to a 75 Ohm load, to a 25 Ohm load, other resistive loads, or other types of output components. If desired, differential coupled lines (along with optional differential transmission lines) can also be used to provide impedance matching between two successive amplifiers exhibiting complex impedance containing both imaginary and real part.

Referring back to FIG. 7, the input coupled lines 74 can differential coupled lines of the type shown in FIG. 5 or single-ended coupled lines. Unlike differential coupled lines that include two pairs of coupled lines, single-ended coupled lines may include only one pair of coupled lines (as shown in the example of FIG. 4), one of which has a first distal end coupled to a preceding circuit and a second distal end connected to ground and another one of which has a first distal end coupled to ground and a second distal end connected to a succeeding circuit. The amount of capacitive and magnetic coupling between these two lines should be designed by selecting a spacing between them to satisfy the required impedance transformation requirement between the preceding and succeeding circuits.

The term "coupled lines" may be defined herein as two or more elongated paths that are routed parallel to one another and that are separated by a spacing that satisfies the required impedance transformation requirement between preceding and succeeding circuits. Paths 74 splitting off or branching out from one set of lines 74 into multiple parallel paths are sometimes referred to as a "fanout" routing path. In the example of FIG. 4, the input coupled lines 74 may be coupled to amplifiers 72 via a 1:N fanout or a 1:N splitter path.

Amplifiers 72 can be single-ended amplifier cells (stages) or differential amplifier cells (stages). FIG. 6 is a circuit diagram of a differential amplifier cell 130. As shown in FIG. 6, differential amplifier cell 130 may include a first input transistor 132, a second input transistor 134, a first capacitive device such as metal-oxide-semiconductor capacitor (MOSCAP) 136, and a second capacitive device such as metal-oxide-semiconductor capacitor (MOSCAP) 138. First input transistor 132 may have a first source-drain terminal coupled to ground line 124, a gate terminal coupled to amplifier differential input port IN, and a second source-drain terminal coupled to amplifier differential output port OUT. Similarly, second input transistor 134 may have a first source-drain terminal coupled to ground line 124, a gate terminal coupled to amplifier differential input port IN, and a second source-drain terminal coupled to amplifier differential output port OUT. The first MOSCAP 136 may be cross-coupled between the gate terminal of transistor 132 and the second source-drain terminal of transistor 134. The second MOSCAP 138 may be cross-coupled between the gate terminal of transistor 134 and the second source-drain terminal of transistor 132. The cross-coupled MOSCAPs 136 and 138 can be configured to cancel out or neutralize any parasitic gate capacitances associated with input transistors 132 and 134. Configured in this way, amplifier 130 is sometimes referred to as a neutralized differential pair (NDP) cell.

Referring back to FIG. 4, amplifiers 72 may be coupled to phased antenna array 62 (as an example). For example, first amplifier 72-1 may be coupled to a first antenna 42-1 in array 62 via first coupled lines 76 and a first phase and magnitude controller 60-1 (sometimes referred to as a first transmit channel); second amplifier 72-2 may be coupled to a second antenna 42-2 in array 62 via second coupled lines 76 and a second phase and magnitude controller 60-2 (sometimes referred to as a second transmit channel); . . . ; and amplifier 72-N may be coupled to an $N^{th}$ antenna 42-N in array 62 via coupled lines 76 and an $N^{th}$ phase and magnitude controller 60-N (sometimes referred to as an $N^{th}$ transmit channel). Each set of coupled lines 76 at the output of an amplifier 72 may represent single-ended coupled lines (as shown in the example of FIG. 4) or differential coupled lines (as shown in FIG. 5). Coupled lines 76 connected at the output of amplifiers 72 are sometimes referred to herein as output coupled lines. In the example of FIG. 4, each antenna 42 is separately driven by a different amplifier 72.

This example in which active power splitter circuitry 78 is configured to drive a phased antenna array 62 is illustrative. In other embodiments, active power splitter circuitry 78 can be used to drive other radio-frequency front end circuits or other load components (e.g., amplifiers 72 each have an output terminal coupled to a separate load component). The embodiment of FIG. 4 showing a 1:N active power divider is exemplary. In general, N can be any power of two.

Unlike passive dividers where all branches are active, active power splitter circuitry 78 can selectively activate and deactivate a subset of the output channels. As an example, active power splitter circuitry 78 of FIG. 4 can be configured to activate (turn on) only one of the channels while deactivating (turning off) the (N-1) remaining unused channels (e.g., by selectively activating only one of the eight amplifiers 72). As another example, active power splitter circuitry 78 can be configured to activate (enable) only two of the channels while deactivating (disabling) the (N-2) remaining unused channels (e.g., by selectively turning on only two of the N amplifiers 72). As another example, active power splitter circuitry 78 can be configured to enable only three of the channels while disabling the (N-3) unused channels (e.g., by selectively turning on only three of the N amplifiers 72). If desired, all of the output amplifiers 72 can be turned off to stop all transmission from phased antenna array 62.

Figure 7:
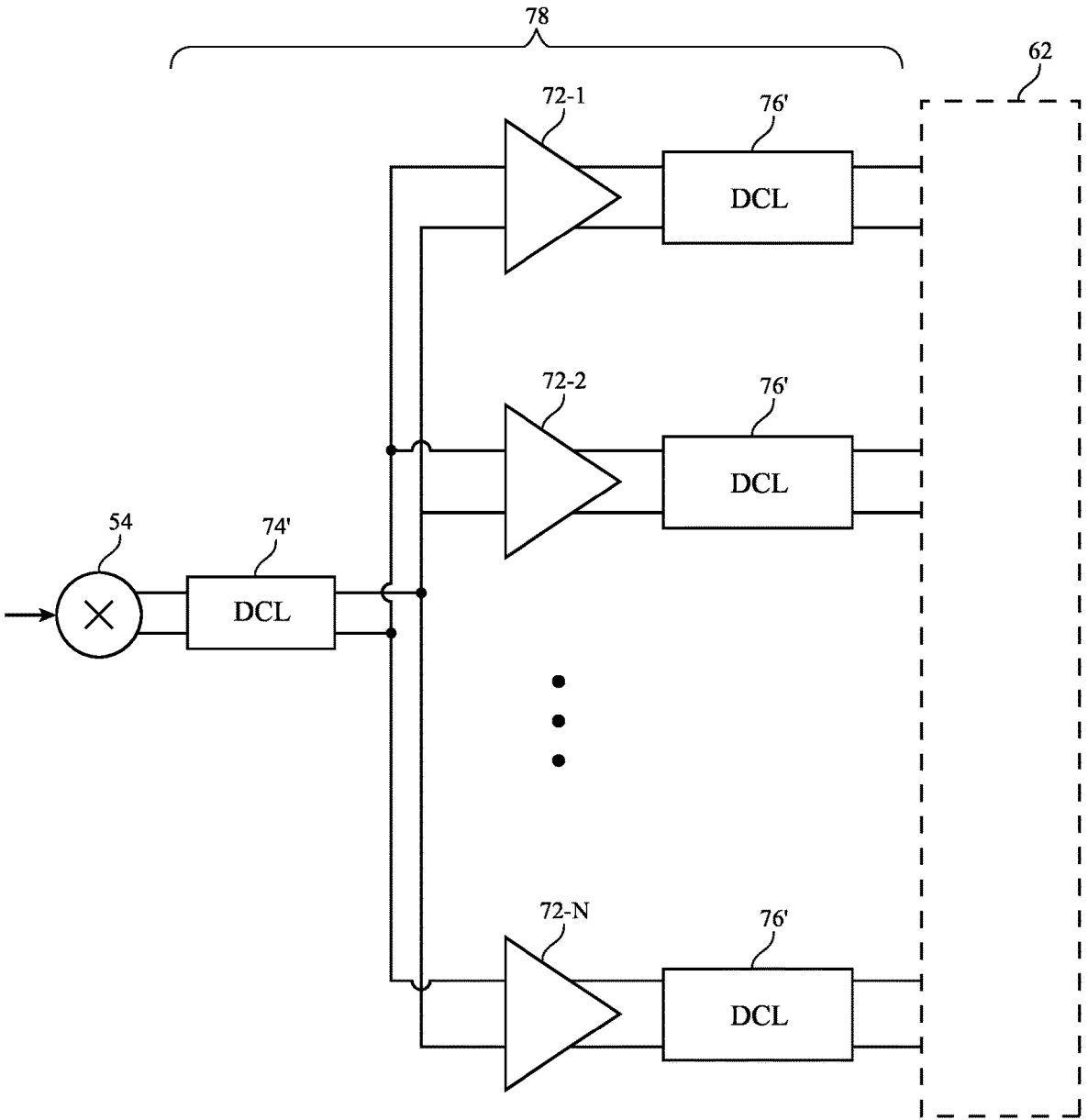
FIG. 7 is a diagram of illustrative active power combiner circuitry having an input stage with differential amplifier inputs in accordance with some embodiments.

FIG. 7 illustrates an embodiment of active power splitter circuitry 78 in which the input coupled lines and the output coupled lines are implemented as differential coupled lines (see, e.g., the differential coupled lines of the type shown in FIG. 5). Each amplifier 72 in FIG. 7 may be a differential amplifier such as an NDP cell of the type shown in FIG. 6

(as an example). As shown in FIG. 7, a set of differential coupled lines 74' may be coupled between mixer 54 and the 1:N fanout/splitter path. Differential coupled lines 74' may therefore provide both impedance matching and routing between mixer 54 and amplifiers 72. The output of each amplifier 72 may be coupled to phased antenna array 62 via a respective set of differential coupled lines 76' (see, e.g., a set of differential coupled lines 120 as shown in FIG. 5). Arranged in this way, differential coupled lines 76' may therefore provide both impedance matching and routing between an amplifier 72 and a corresponding antenna in array 62.

Figure 8:
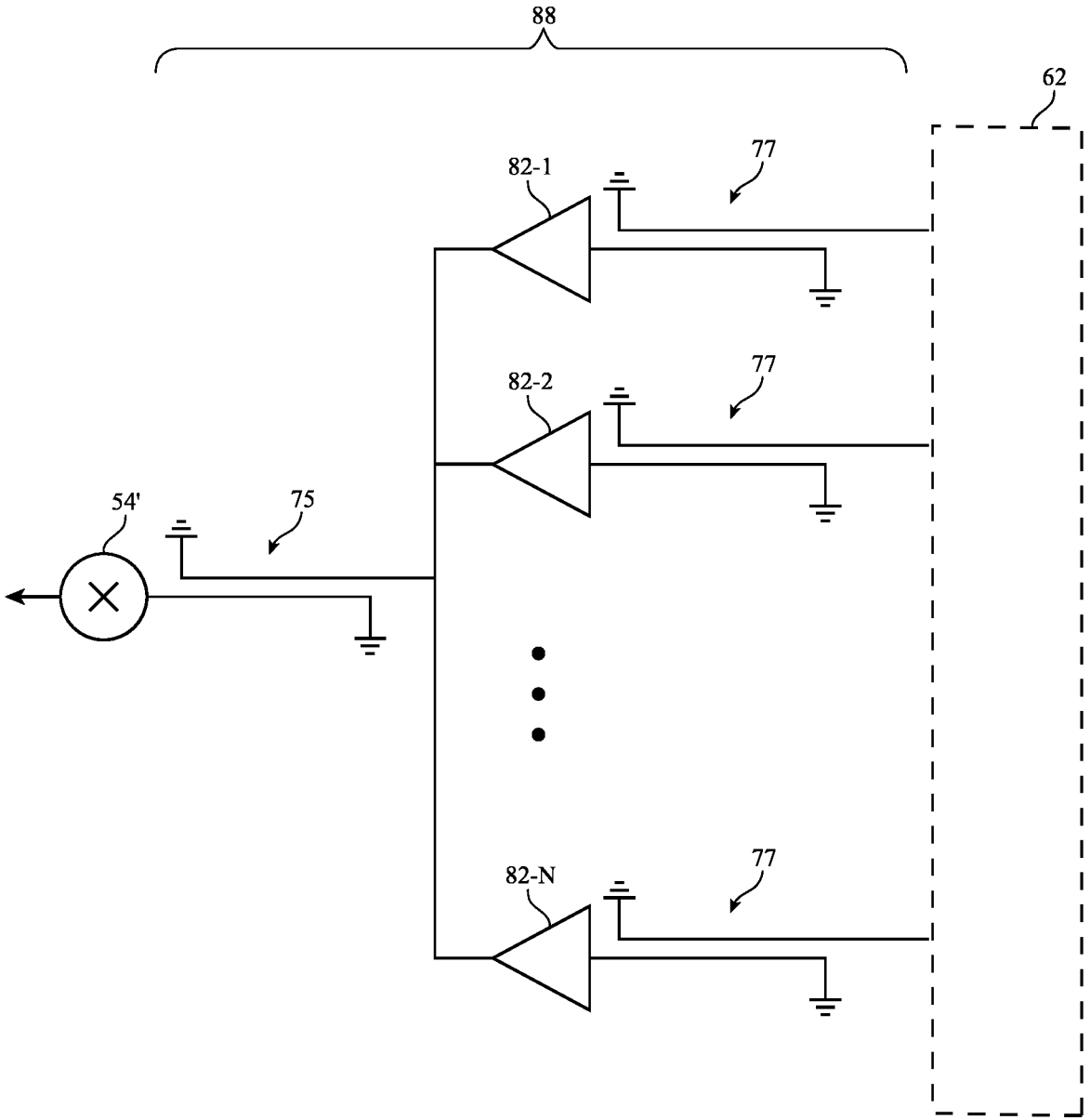
FIG. 8 is a diagram of an illustrative radio-frequency signal path including differential coupled lines configured to provide output matching for an amplifier in accordance with some embodiments.

The 1:N active power splitter circuitry 78 of FIG. 4 for driving phased antenna array 62 for wireless transmission is exemplary. A similar active fan-in architecture can also be applied to an active power combiner for wireless reception. FIG. 8 is a diagram of active power combiner circuitry 88 that exhibits lower loss and higher gain performance relative to conventional passive power combiners. The active power combiner architecture of FIG. 8 is similar to that of FIG. 4 except amplifiers 82 are employed in the reverse direction for receiving wireless signals from the phased antenna array 62. For example, a first antenna in array 62 can be coupled to amplifier 82-1 via first input coupled lines 77, a second antenna in array 62 can be coupled to amplifier 82-2 via second input coupled lines 77, . . . , and an $N^{th}$ antenna in array 62 can be coupled to amplifier 82-N via $N^{th}$ input coupled lines 77. Input coupled lines 77 can represent single-ended coupled lines or differential coupled lines (see, e.g., differential coupled lines 120 of FIG. 5). Amplifiers 82 can be single-ended amplifier cells or differential amplifier cells (see, e.g., NDP cell 130 of FIG. 6).

The output of each amplifier 82 can be coupled to a common set of output coupled lines 75. Multiple paths merging together into a fewer number of downstream paths are sometimes referred to as a "fan-in" routing path. Output coupled lines 75 can represent single-ended coupled lines or differential coupled lines (see, e.g., differential coupled lines 120 of FIG. 5). Mixer 54' is a receiving (demodulating) mixing circuit. Active power combiner circuitry 88 of FIG. 8 may be an N:1 active power combiner and is sometimes referred to as a combiner, a radio-frequency combiner, or a radio-frequency power combiner.

Unlike passive combiners where all branches are active, active power combiner circuitry 88 can selectively activate and deactivate a subset of the input channels. As an example, active power combiner circuitry 88 of FIG. 8 can be configured to activate (turn on) only one of the channels while deactivating (turning off) the (N-1) remaining unused channels (e.g., by selectively activating only one of the N amplifiers 82). As another example, active power combiner circuitry 88 can be configured to activate (enable) only two of the channels while deactivating (disabling) the (N-2) remaining unused channels (e.g., by selectively turning on only two of the N amplifiers 82). If desired, all of the amplifiers 82 can be turned off or idled to temporarily suspend reception via phased antenna array 62.

Figure 9:
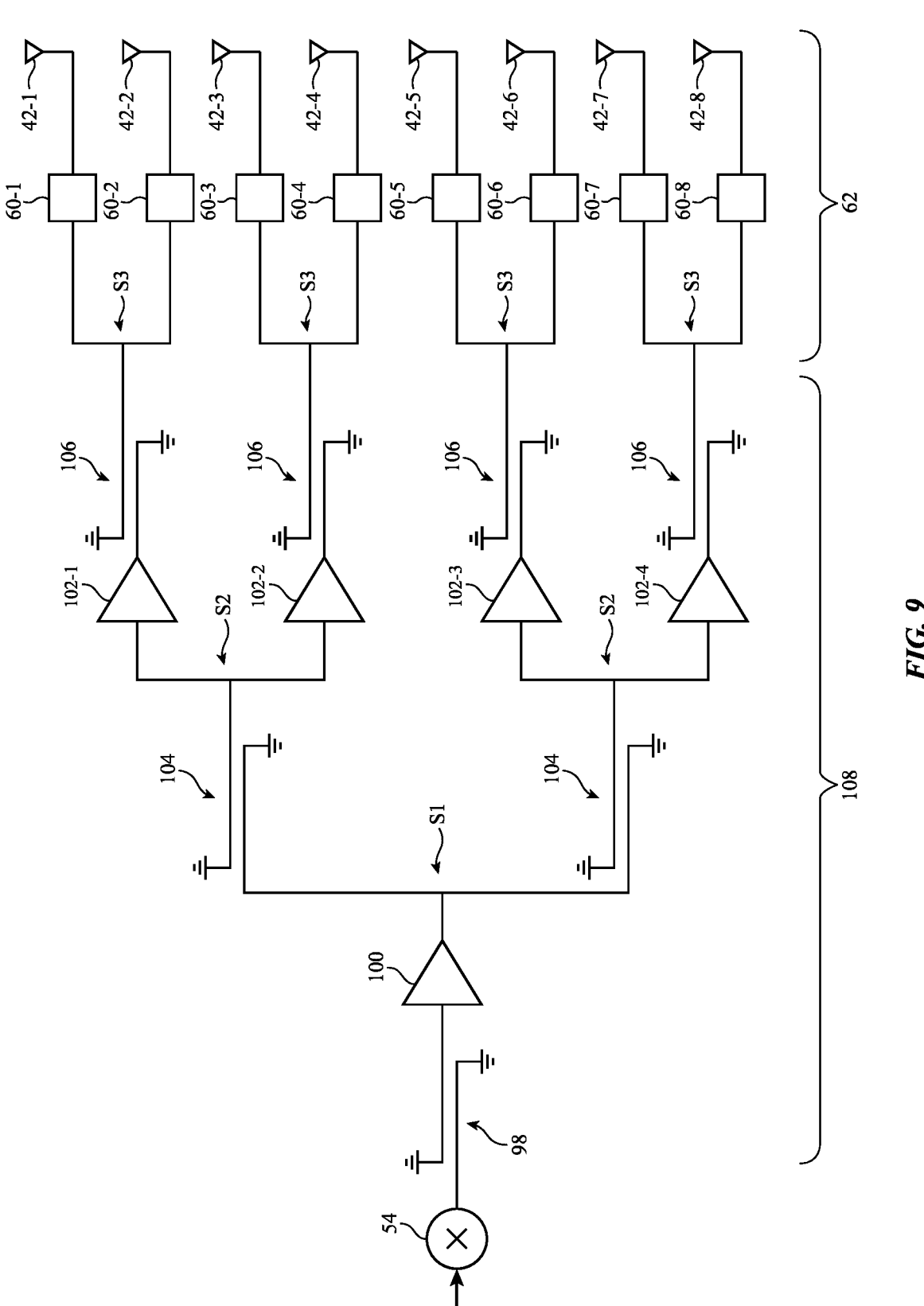
FIG. 9 is a cross-sectional side view of illustrative edge-coupled strip lines in accordance with some embodiments.

The active power splitter circuitry 78 of FIG. 4 and FIG. 7 having N amplifiers for driving the N respective channels is exemplary. FIG. 9 illustrates another embodiment of active power splitter circuitry 108 having only N/2 output amplifiers 102. Active splitter circuitry 108 can exhibit lower loss and higher gain performance relative to conventional passive power dividers. Active power divider circuitry 108 of FIG. 9 may be a 1:8 active power divider and is sometimes referred to as a splitter, a radio-frequency splitter, or a radio-frequency power splitter. Power divider circuitry 108 can be configured to divide an input signal into multiple output branches or channels with a high degree of isolation between the various output channels (i.e., to ensure minimal crosstalk between the different channels). Active power divider circuitry 108 may include a first amplifier stage (sometimes referred to as an input stage) and a second amplifier stage (sometimes referred to as an output stage).

The first amplifier stage of active power divider circuitry 108 may include a single (only one) input amplifier 100 having an input port coupled to an output of transmitting mixer 54 via input coupled lines 98. Input coupled lines 98 at the input of amplifier 100 may represent a pair of single-ended coupled lines (as shown in the example of FIG. 9) or a set of differential coupled lines (as shown in FIG. 5). Amplifier 100 may represent a single-ended amplifier cell or a differential amplifier cell (see, e.g., NDP cell 130 of FIG. 6).

Amplifier 100 may have an output port that is coupled to the second amplifier stage via one or more splits (fanout paths). As shown in FIG. 9, a first 1:2 split (S1) at the output of amplifier 100 routes a first half of the output signal through first coupled lines 104 and routes a second half of the output signal through second coupled lines 104. Each set of coupled lines 104 after the S1 split may represent a pair of single-ended coupled lines (as shown in the example of FIG. 9) or a set of differential coupled lines (as shown in the example of FIG. 5).

A second 1:2 split (S2) at the output of the first coupled lines 104 routes a first half of the arriving signal to amplifier 102-1 while routing a second half of the arriving signal to amplifier 102-2. A third 1:2 split (S2) at the output of the second coupled lines 104 routes a first half of the arriving signal to amplifier 102-3 while routing a second half of the arriving signal to amplifier 102-4. Amplifiers 102 may each represent a single-ended amplifier cell or a differential amplifier cell (see, e.g., NDP cell 130 of FIG. 6). Amplifiers 102 in the second output amplifier stage are sometimes referred to as output amplifiers.

The second amplifier stage of active splitter circuitry 108 may be coupled to phased antenna array 62 (as an example). For example, first output amplifier 102-1 may be coupled to a first antenna 42-1 in array 62 via first coupled lines 106 and a first phase and magnitude controller 60-1 (sometimes referred to as a first transmit channel) and may be coupled to a second antenna 42-1 in array 62 via the first coupled lines 106 and a second phase and magnitude controller 60-2 (sometimes referred to as a second transmit channel). A fourth 1:2 split (S3) may occur at the output of the first coupled lines 106. The first coupled lines 106 may represent a pair of single-ended coupled lines (as shown in the example of FIG. 9) or a set of differential coupled lines (as shown in the example of FIG. 5).

Second output amplifier 102-1 may be coupled to a third antenna 42-3 in array 62 via second coupled lines 106 and a third phase and magnitude controller 60-3 (sometimes referred to as a third transmit channel) and may be coupled to a fourth antenna 42-4 in array 62 via the second coupled lines 106 and a fourth phase and magnitude controller 60-4 (sometimes referred to as a fourth transmit channel). A fifth 1:2 split (S3) may occur at the output of the second coupled lines 106. The second coupled lines 106 may represent a pair of single-ended coupled lines (as shown in the example of FIG. 9) or a set of differential coupled lines (as shown in the example of FIG. 5).

Third output amplifier 102-3 may be coupled to a fifth antenna 42-5 in array 62 via third coupled lines 106 and a fifth phase and magnitude controller 60-5 (sometimes referred to as a fifth transmit channel) and may be coupled to a sixth antenna 42-6 in array 62 via the third coupled lines 106 and a sixth phase and magnitude controller 60-6 (sometimes referred to as a sixth transmit channel). A sixth 1:2 split (S3) may occur at the output of the third coupled lines 106. The third coupled lines 106 may represent a pair of single-ended coupled lines (as shown in the example of FIG. 9) or a set of differential coupled lines (as shown in the example of FIG. 5).

Fourth output amplifier 102-4 may be coupled to a seventh antenna 42-7 in array 62 via fourth coupled lines 106 and a seventh phase and magnitude controller 60-7 (sometimes referred to as a seventh transmit channel) and may be coupled to an eighth antenna 42-8 in array 62 via the fourth coupled lines 106 and an eighth phase and magnitude controller 60-8 (sometimes referred to as an eighth transmit channel). A seventh 1:2 split (S3) may occur at the output of the fourth coupled lines 106. The fourth coupled lines 106 may represent a pair of single-ended coupled lines (as shown in the example of FIG. 9) or a set of differential coupled lines (as shown in the example of FIG. 5). In scenarios where the S3 splits at the output of each set of coupled lines 106 are implemented using differential coupled lines, the two output channels driven by each output amplifier 102 be driven with a 180 degree phase offset. Compared to the embodiment of FIG. 4, the embodiment of FIG. 9 utilizes fewer amplifiers and thus reduces the overall design and routing complexity.

This example in which active power splitter circuitry 108 is configured to drive a phased antenna array 62 is illustrative. In other embodiments, active power splitter circuitry 108 can be used to drive other radio-frequency front end circuits or other load components (e.g., each output amplifier 102 can have first and second output terminals coupled to different load components). The embodiment of FIG. 9 showing a 1:8 active power divider is exemplary. If desired, such type of dual stage fanout arrangement having one amplifier 100 in the first stage and N/2 amplifiers 102 in the second stage can be extended to a 1:2 active power divider architecture, a 1:4 active power divider architecture, a 1:16 active power divider architecture, a 1:32 active power divider architecture, or generally a 1:N active power divider architecture, where N is a power of two.

Unlike passive dividers where all branches are active, active power splitter circuitry 108 can selectively activate and deactivate a subset of the output channels. As an example, active power divider circuitry 108 of FIG. 9 can be configured to activate (turn on) only a pair of channels while deactivating (turning off) the six remaining channels (e.g., by selectively activating only one of the four output amplifiers 102). As another example, active power divider circuitry 108 can be configured to activate (enable) only two pairs of channels while deactivating (disabling) the four remaining channels (e.g., by selectively turning on only two of the four output amplifiers 102). As another example, active power divider circuitry 108 can be configured to enable only three pairs of channels while disabling the two remaining channels (e.g., by selectively turning on only three of the four output amplifiers 102). If desired, all of the output amplifiers 102 can be turned off to temporarily suspend all transmission from phased antenna array 62.

Figure 10:
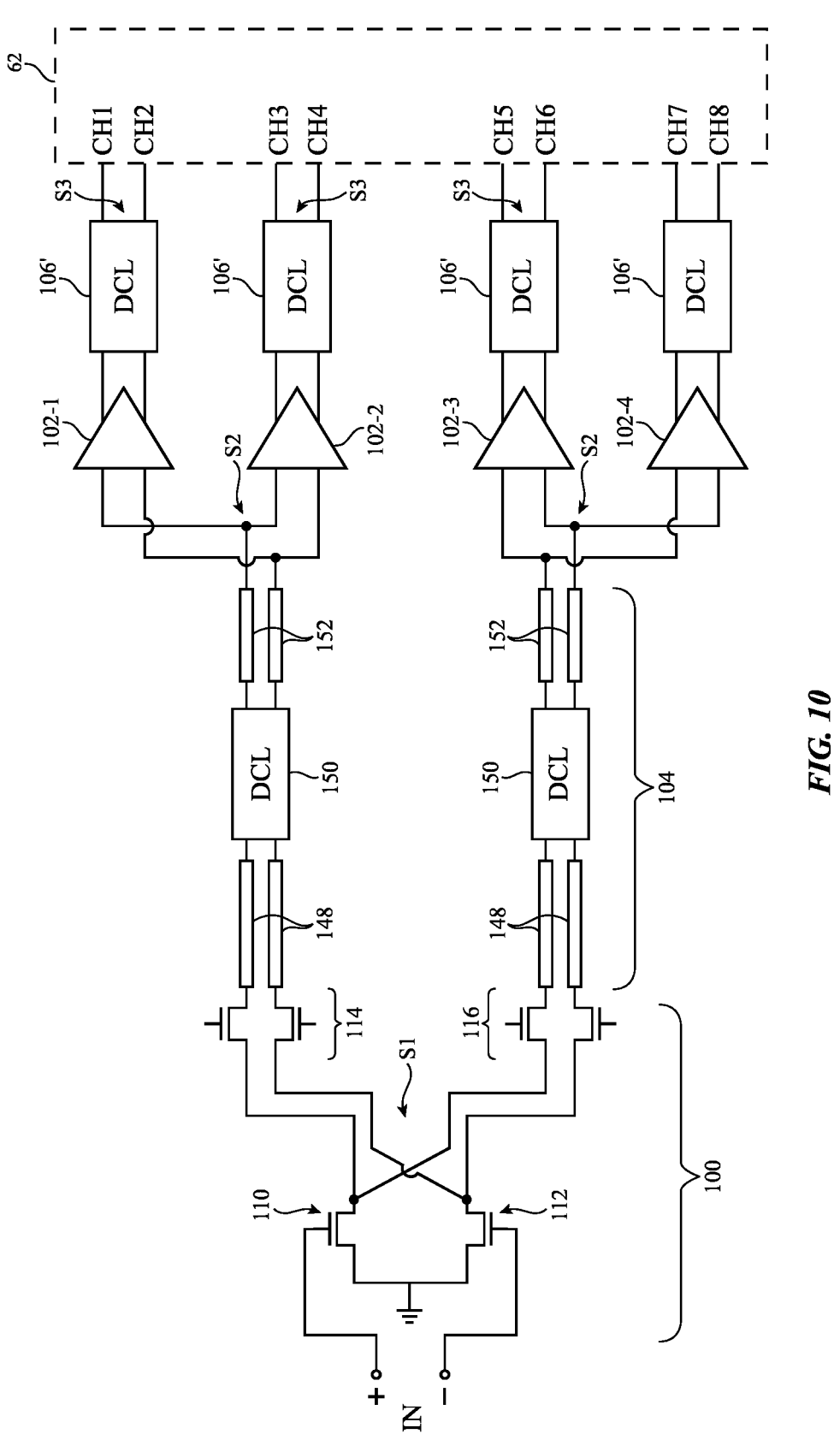
FIG. 10 is a cross-sectional side view of illustrative broadside-coupled strip lines in accordance with some embodiments.

FIG. 10 illustrates an embodiment of active power splitter circuitry 108 in which the first and second coupled lines 104 are implemented using differential coupled lines and where the first, second, third, and fourth coupled lines 106' are also implemented using differential coupled lines. As shown in FIG. 10, the input amplifier 100 may be a differential amplifier implemented using input transistors 110 and 112 and cascode transistors 114 and 116. Input transistors 110 and 112 having their source nodes connected to ground can be referred to and defined as "common source" transistors, whereas the cascode transistors 114 and 116 having their gate nodes connected to static bias voltages can be referred to and defined as "common gate" transistors. The 2:1 S1 split can be implemented as a balanced current split between the common source transistors and the common gate transistors.

The first coupled lines 104 can include a first set of differential coupled lines 150. A first set of differential transmission lines 148 can optionally be coupled to the input of the first set of differential coupled lines 150. A first set of differential transmission lines 152 can optionally be coupled to the output of the first set of differential couple lines 150. Similarly, the second coupled lines 104 can include a second set of differential coupled lines 150. A second set of differential transmission lines 148 can optionally be coupled to the input of the second set of differential coupled lines 150. A second set of differential transmission lines 152 can optionally be coupled to the output of the second set of differential couple lines 150.

Amplifiers 102 can be implemented as differential amplifiers (see, e.g., NDP cell 130 of the type shown in FIG. 6). The 2:1 S2 splits can occur at the input of these differential amplifiers 102. Each output amplifier 102 may drive a pair of output channels via a respective set of differential coupled lines. In the example of FIG. 10, first output amplifier 102-1 may be configured to drive channels CH1 and CH2 in phased antenna array 62 via a first set of differential coupled lines 106'; second output amplifier 102-2 may be configured to drive channels CH3 and CH4 in phased antenna array 62 via a second set of differential coupled lines 106'; third output amplifier 102-3 may be configured to drive channels CH5 and CH6 in phased antenna array 62 via a third set of differential coupled lines 106'; and fourth output amplifier 102-4 may be configured to drive channels CH7 and CH8 in phased antenna array 62 via a fourth set of differential coupled lines 106'. The final 2:1 S3 splits can occur using the differential output connection of each set of different coupled lines 106' (e.g., by routing one phase of the differential output to a first channel and by routing the opposite phase of the differential output to a second channel). Any phase difference between the two channels can be corrected using a phase shifter (e.g., a 180 degree phase shifter such as phase controller 60) within phased antenna array 62.

Figure 11:
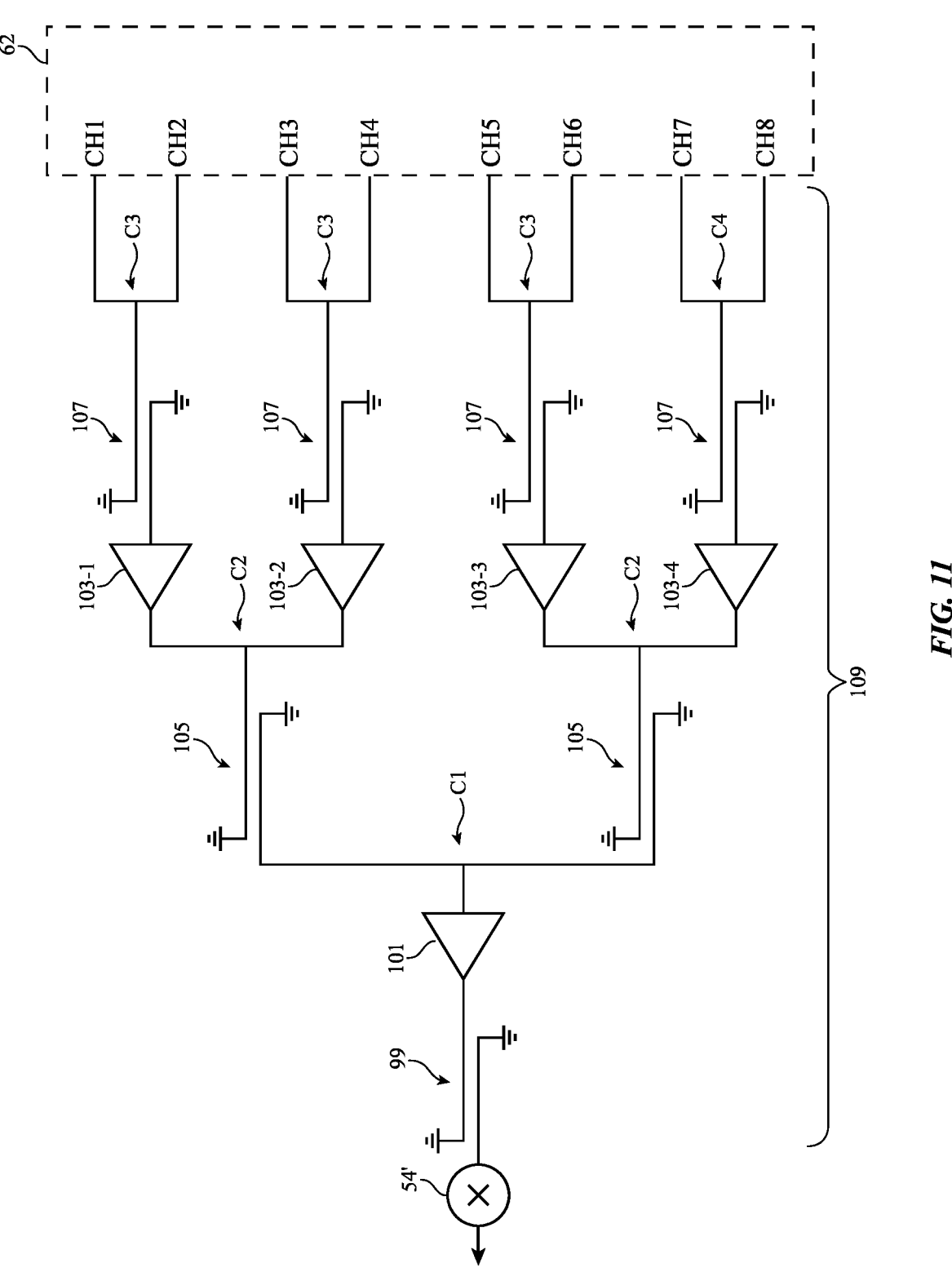
FIG. 11 is a diagram of an illustrative radio-frequency signal path including a first amplifier stage, a second amplifier stage, and differential coupled lines for providing inter-stage matching between the first and second amplifier stages in accordance with some embodiments.

The 1:N active power splitter circuitry 108 of FIG. 9 for driving phased antenna array 62 for wireless transmission is exemplary. A similar active fan-in architecture can also be applied to an active power combiner for wireless reception. FIG. 11 is a diagram of active power combiner circuitry 109 that exhibits lower loss and higher gain performance relative to conventional passive power combiners. The active power combiner architecture of FIG. 11 is similar to that of FIG. 9 except amplifiers 101 and 103 are employed in the reverse direction for receiving wireless signals from the phased antenna array 62.

For example, a first pair of channels (e.g., CH1 and CH2) can be combined at 2:1 combination node C3 and conveyed to first input amplifier 103-1 via a first set of coupled lines 107. The first set of coupled lines 107 may represent single-ended coupled lines (as shown in the example of FIG. 11) or differential coupled lines (as shown in the example of FIG. 5). Amplifier 103-1 may represent a single-ended amplifier cell or a differential amplifier cell (see, e.g., NDP cell 130 of FIG. 6).

A second pair of channels (e.g., CH3 and CH4) can be combined at another 2:1 combination node C3 and conveyed to second input amplifier 103-2 via a second set of coupled lines 107. The second set of coupled lines 107 may represent single-ended coupled lines (as shown in the example of FIG. 11) or differential coupled lines (as shown in the example of FIG. 5). Amplifier 103-2 may represent a single-ended amplifier cell or a differential amplifier cell (see, e.g., NDP cell 130 of FIG. 6).

A third pair of channels (e.g., CH5 and CH6) can be combined at another 2:1 combination node C3 and conveyed to third input amplifier 103-3 via a third set of coupled lines 107. The third set of coupled lines 107 may represent single-ended coupled lines (as shown in the example of FIG. 11) or differential coupled lines (as shown in the example of FIG. 5). Amplifier 103-3 may represent a single-ended amplifier cell or a differential amplifier cell (see, e.g., NDP cell 130 of FIG. 6).

A fourth pair of channels (e.g., CH7 and CH8) can be combined at another 2:1 combination node C3 and conveyed to fourth input amplifier 103-4 via a fourth set of coupled lines 107. The fourth set of coupled lines 107 may represent single-ended coupled lines (as shown in the example of FIG. 11) or differential coupled lines (as shown in the example of FIG. 5). Amplifier 103-4 may represent a single-ended amplifier cell or a differential amplifier cell (see, e.g., NDP cell 130 of FIG. 6). Amplifiers 103 may be referred to as being part of a first amplifier stage in active combiner circuitry 109.

Amplifiers 103-1 and 103-2 may have outputs connected to 2:1 combination node C2, which is coupled to 2:1 combination node C1 via a first set of coupled lines 105. The first set of coupled lines 105 may represent single-ended coupled lines (as shown in the example of FIG. 11) or differential coupled lines (as shown in the example of FIG. 5). Similarly, amplifiers 103-3 and 103-4 may have outputs connected to another 2:1 combination node C2, which is coupled to 2:1 combination node C1 via a second set of coupled lines 105. The second set of coupled lines 105 may represent single-ended coupled lines (as shown in the example of FIG. 11) or differential coupled lines (as shown in the example of FIG. 5). Output amplifier 101 may represent a single-ended amplifier cell or a differential amplifier cell (see, e.g., NDP cell 130 of FIG. 6). Output coupled lines 99 connected to the output port of amplifier 101 can represent single-ended coupled lines (as shown in the example of FIG. 11) or differential coupled lines (as shown in the example of FIG. 5). Amplifier 101 may be referred to as being part of a second amplifier stage in active combiner circuitry 109.

The architecture of active power combiner circuitry 109 of FIG. 11 may be extended to an N:1 active power combiner and is sometimes referred to as a combiner, a radio-frequency combiner, or a radio-frequency power combiner. Unlike passive combiners where all branches are active, active power combiner circuitry 109 can selectively activate and deactivate a subset or all of the input channels.

The methods and operations described above in connection with FIGS. 1-11 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Power splitter circuitry comprising:
a first amplifier stage; and
a second amplifier stage configured to receive radio-frequency signals from the first amplifier stage, the second amplifier stage including
  a first output amplifier coupled to first and second output channels,
  a first set of differential coupled lines coupling the first output amplifier to the first and second output channels and configured to provide impedance matching between the first output amplifier and the first and second output channels, and
  a second output amplifier coupled to third and fourth output channels.

2. The power splitter circuitry of claim 1, wherein:
the first output channel comprises a first antenna;
the second output channel comprises a second antenna;
the third output channel comprises a third antenna; and
the fourth output channel comprises a fourth antenna.

3. The power splitter circuitry of claim 2, wherein:
the first output channel further comprises a first phase and magnitude controller coupled between the first output amplifier and the first antenna;
the second output channel further comprises a second phase and magnitude controller coupled between the first output amplifier and the second antenna;
the third output channel further comprises a third phase and magnitude controller coupled between the second output amplifier and the third antenna; and
the fourth output channel further comprises a fourth phase and magnitude controller coupled between the second output amplifier and the fourth antenna.

4. The power splitter circuitry of claim 1, wherein the second amplifier stage further includes:
a third output amplifier coupled to fifth and sixth output channels, and
a fourth output amplifier coupled to seventh and eighth output channels.

5. The power splitter circuitry of claim 4, wherein the first, second, third and fourth output amplifiers comprise differential amplifiers.

6. The power splitter circuitry of claim 5, further comprising:
a second set of differential coupled lines coupling the second output amplifier to the third and fourth output channels;
a third set of differential coupled lines coupling the third output amplifier to the fifth and sixth output channels; and a fourth set of differential coupled lines coupling the fourth output amplifier to the seventh and eighth output channels.

7. The power splitter circuitry of claim 5, further comprising:

a first set of differential coupled lines coupled between the first amplifier stage and the first and second output amplifiers; and a second set of differential coupled lines coupled between the first amplifier stage and the third and fourth output amplifiers.

8. The power splitter circuitry of claim 7, wherein the first amplifier stage comprises a differential amplifier having first and second input transistors and two pairs of cascode transistors.

9. The power splitter circuitry of claim 1, wherein the first set of differential coupled lines comprises:

a first pair of coupled lines coupled between the first output amplifier and the first output channel; and a second pair of coupled lines coupled between the first output amplifier and the second output channel.

10. The power splitter circuitry of claim 9, wherein:

the first pair of coupled lines comprises a first conductive path having a first distal end coupled to the first output amplifier and having a second distal end coupled to a bias voltage line, and a second conductive path routed along the first conductive path and having a first distal end coupled to a ground line and having a second distal end coupled to the first output channel; and the second pair of coupled lines comprises a third conductive path having a first distal end coupled to the first output amplifier and having a second distal end coupled to the bias voltage line, and a fourth conductive path routed along the third conductive path and having a first distal end coupled to the ground line and having a second distal end coupled to the second output channel.

11. Wireless circuitry comprising:

a mixer; and active circuitry coupled between the mixer and a plurality of antennas, the active circuitry having a first amplifier stage, a second amplifier stage configured to receive radio-frequency signals from the first amplifier stage, and at least first and second sets of differential coupled lines coupled between the first and second amplifier stages and configured to provide impedance matching between the first and second amplifier stages.

12. The wireless circuitry of claim 11, wherein the active circuitry comprises active splitter circuitry, and wherein the first set of differential coupled lines comprises:

a first pair of coupled lines coupled between the first amplifier stage and first and second differential amplifiers in the second amplifier stage; and a second pair of coupled lines coupled between the first amplifier stage and the first and second differential amplifiers in the second amplifier stage.

13. The wireless circuitry of claim 12, the active splitter circuitry further comprising:

a third set of differential coupled lines coupling the first differential amplifier to first and second antennas in the plurality of antennas; and a fourth set of differential coupled lines coupling the second differential amplifier to the third and fourth antennas in the plurality of antennas.

14. The wireless circuitry of claim 11, wherein the active circuitry comprises active combiner circuitry, and wherein the first set of differential coupled lines comprises:

a first pair of coupled lines coupled between first and second differential amplifiers in the first amplifier stage and the second amplifier stage; and a second pair of coupled lines coupled between the first and second differential amplifiers in the first amplifier stage and the second amplifier stage.

15. The wireless circuitry of claim 14, the active combiner circuitry further comprising:

a third set of differential coupled lines coupling first and second antennas in the plurality of antennas to the first differential amplifier; and a fourth set of differential coupled lines third and fourth antennas in the plurality of antennas to the second differential amplifier.

16. Active splitter circuitry comprising:

a first amplifier having an input directly connected to a set of input coupled lines and configured to drive a first load component;

a second amplifier having an input directly connected to the set of input coupled lines and configured to drive a second load component;

a third amplifier having an input directly connected to the set of input coupled lines and configured to drive a third load component; and a fourth amplifier having an input directly connected to the set of input coupled lines and configured to drive a fourth load component.

17. The active splitter circuitry of claim 16, wherein:

the first load component comprises a first antenna in a phased antenna array;

the second load component comprises a second antenna in the phased antenna array;

the third load component comprises a third antenna in the phased antenna array; and the fourth load component comprises a fourth antenna in the phased antenna array.

18. The active splitter circuitry of claim 16, wherein the input coupled lines comprises a pair of single-ended coupled lines or a set of differential coupled lines.

19. The active splitter circuitry of claim 16, further comprising:

a first pair of single-ended coupled lines or a first set of differential coupled lines coupled between the first amplifier and the first load component;

a second pair of single-ended coupled lines or a second set of differential coupled lines coupled between the second amplifier and the second load component;

a third pair of single-ended coupled lines or a third set of differential coupled lines coupled between the third amplifier and the third load component; and a fourth pair of single-ended coupled lines or a fourth set of differential coupled lines coupled between the fourth amplifier and the fourth load component.

* * * * *